United States Patent [19]

Ablassmeier

[11] 3,987,312
[45] Oct. 19, 1976

[54] DEVICE FOR THE SELECTIVE STORAGE OF CHARGES AND FOR SELECTIVE CHARGE SHIFT IN BOTH DIRECTIONS WITH A CHARGE-COUPLED CHARGE SHIFT ARRANGEMENT

[75] Inventor: Ulrich Ablassmeier, Waltenhofen, Germany

[73] Assignee: Siemens Aktiengesellschaft, Berlin & Munich, Germany

[22] Filed: June 3, 1975

[21] Appl. No.: 583,287

[30] Foreign Application Priority Data
June 5, 1974 Germany............................ 2427173

[52] U.S. Cl.............................. 307/221 D; 307/269; 357/24
[51] Int. Cl.²................. G11C 19/28; G11C 11/34; H03K 25/02
[58] Field of Search............ 307/221 C, 221 D, 269; 357/24

[56] References Cited
UNITED STATES PATENTS

| | | | |
|---|---|---|---|
| 3,651,349 | 3/1972 | Kahng et al. | 307/221 C |
| 3,789,247 | 1/1974 | Beausoleil et al. | 307/221 C |
| 3,819,959 | 6/1974 | Chang et al. | 307/221 D |
| 3,902,187 | 8/1975 | Engeler et al. | 307/221 D |

*Primary Examiner*—John Zazworsky
*Attorney, Agent, or Firm*—Hill, Gross, Simpson, Van Santen, Steadman, Chiara & Simpson

[57] ABSTRACT

A device for selectively shifting charges in a given direction, or in the opposite direction, and for storing charges selectively employs a charge coupled charge shift arrangement having a substrate of doped semiconductor material, an electrical insulating layer on the substrate and at least one row of first electrodes on the insulating layer which are separated from one another by gaps and at least one row of second electrodes arranged at least over each gap and insulated from the first electrodes. In addition to contacts for introducing and withdrawing charges, first contact lines connect each first electrode to alternate ones of the first electrodes in the row and second contact lines connect each second electrode to alternate ones of the second electrodes in the row. Each of the contact lines which serves to connect the first electrodes is capacitively connected to the contact lines which serve to connect the second electrodes directly adjacent on the one side of the first electrodes. Either of the two contact lines which serve to connect the first electrodes or the other two contact lines are provided with a terminal for receiving respective pulse trains. A d.c. voltage supply is connected by way of a commutator switch to the first and second contact lines, the commutator switch having two closed and an open switch condition. The contact lines which are not provided with terminals for receiving pulse trains are each connected by way of an on-off switch to a further terminal of an electrical supply and the substrate is connected to another supply terminal.

11 Claims, 7 Drawing Figures

DEVICE FOR THE SELECTIVE STORAGE OF CHARGES AND FOR SELECTIVE CHARGE SHIFT IN BOTH DIRECTIONS WITH A CHARGE-COUPLED CHARGE SHIFT ARRANGEMENT

BACKGROUND OF THE INVENTION

1. Field of the Invention

This invention relates to a device for the selective shifting of charges in a given direction, or in the opposite direction, and for the selective storage of charges, and more particularly the present invention relates to a device for the selective shifting of charges in a given direction or in the opposite direction and for the selective storage of charges with a charge-coupled charge shift arrangement, comprising a substrate consisting of doped semiconductor material to which is applied at least one first electrically insulating layer carrying at least one row of first electrodes separated from one another by gaps, and in which a second electrode is in each case arranged at least over each gap and is insulated from the first electrodes, and which possesses means for the introduction and withdrawal of charges and in which each first electrode is connected to the next, and in which one first electrode in the row and each second electrode is connected to the next, and in which one second electrode in the row in each case is connected to a contact line consisting of electrically conductive materials.

2. Description of the Prior Art

Devices of the type described in the introduction are generally known in the art. Such a device is described, for example, in "A Memory Based On Surface-Charge-Transport" by Engler, Tiemann, Baertsch in the IEEE, J. of Solid-State Circuits, Vol.SC-6 No. 5, Oct. 1971, pp. 306–313, in which, during operation, a first and second timing pulse train, corresponding to the two-phase operation of a charge-coupled charge shift device, are connected in each case to one of the two contact lines which serve to connect first electrodes. In addition, two further timing pulse trains are required to determine the charge shift direction. These are connected to the two other contact lines so as to be able to be transferred. During the storage process, the other timing pulse trains are disconnected. Thus, the device in question requires four timing pulses, which corresponds to four-phase operation.

SUMMARY OF THE INVENTION

The object of the present invention is to provide a device of the type described above in which two-phase operation is possible, and which therefore requires only two timing pulse trains during operation.

This object is realized in a device of the type described in the introduction, in that, in accordance with the invention, each contact line which serves to connect first electrodes is capacitively connected by at least one capacitor to the contact line which connects the second electrodes, which are directly adjacent on the one side of the first electrodes. Then, either the two contact lines which serve to connect first electrodes, or the two other contact lines, are each provided with a terminal, and the contact lines which are capacitively connected to each other are each connected to one terminal of a commutator switch, wherein the commutator switches exhibit, in addition to the two closed switching possibilities, also an "open" switching state. The contact lines which are not provided with terminals are each connected to a further terminal via an on-off switch, and the substrate is provided with a substrate terminal.

Preferably, electronic switches are employed as commutator switches and on-off switches.

Advantageously, the two commutator switches and/or the two on-off switches are in the form of double-pole switches.

Preferably, in a device as described above the substrate consists of doped silicon.

Preferably also, the first electrodes consist of polysilicon, the second electrodes consist of aluminum and the first electrically insulating layer consists of $SiO_2$.

In a device constructed in accordance with the invention, the capacitances are advantageously integrally produced, in that each first electrode is overlapped at least by the second adjacent electrode on the one side, where the overlap width is greater than that of the adjacent second electrode on the other side.

Another advantageous embodiment of a device constructed in accordance with the invention is characterized in that the capacitances are produced with a structure wherein the contact lines are in the form of strips which run in parallel to the substrate surface in the longitudinal direction of the row on both sides of the row of electrodes, wherein on each side two such strips lie in different planes and overlap in length, wherein in each case the lower strip is arranged above the first electrically insulating layer, and the overlying strip in the overlap zone is separated from the lower strip by electrically insulating material, and wherein the lower strips are connected to the first electrodes and the upper strips are connected to the second electrodes.

Further embodiments of the invention will become apparent from the detailed description and the claims.

The advantages of devices constructed in accordance with the invention, in comparison to those of the prior art, lie in the fact that the device can be operated in two-phase operation without the necessity for a considerable extra expense in terms of circuitry and technology. The production of the capacitances presents no problems technologically and, at the maximum, produces a slight additional production cost. The slight extra cost for switches is fully outweighed by the advantages of two-phase operation in comparison to four-phase operation.

BRIEF DESCRIPTION OF THE DRAWINGS

Other objects, features and advantages of the invention, its organization, construction and operation will be best understood from the following detailed description making reference to the drawings, on which.

DESCRIPTION OF THE PREFERRED EMBODIMENT

Figure 1:
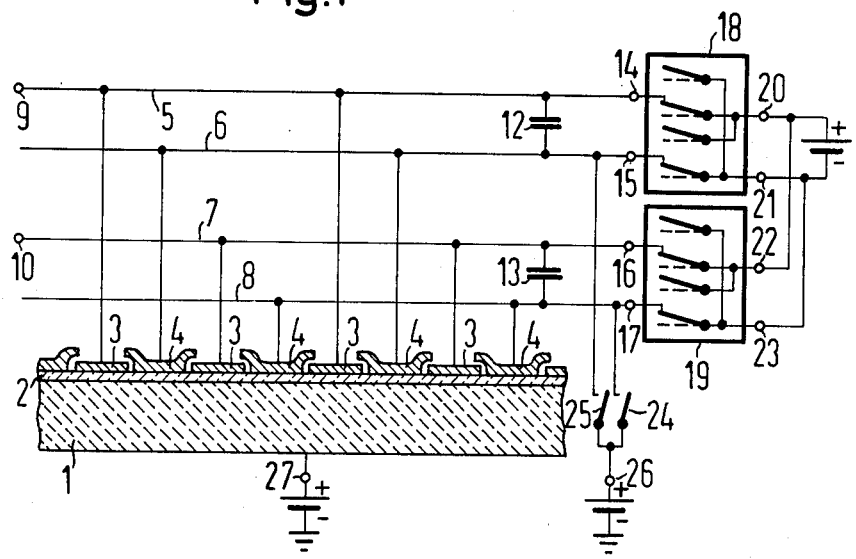
FIG. 1 schematically illustrates the construction of a device in accordance with the invention.

In FIG. 1, a first insulating layer 2 is arranged on a substrate 1. The insulating layer 2 carries a plurality of first electrodes 3 and a plurality of second electrodes 4. The first electrodes 3 are connected to one another by a pair of contact lines 5 and 7 and the second electrodes by a pair of contact lines 6 and 8. The contact lines 5 and 7 possess the terminals 9 and 10. However, instead of the contact lines 5 and 7, the contact lines 6 and 8 can also possess these terminals. A pair of capacitors 12 and 13, which are preferably of equal capacity, are respectively connected between the contact lines 5 and 6 and the contact lines 7 and 8. In addition, the contact lines 5 and 6 and the contact lines 7 and 8 are respectively connected to a pair of terminals 14 and 15. and to a pair of terminals 16 and 17 of a pair of commutator switches 18 and 19. By means of these commutator switches it is possible to reverse the polarity supplied to a pair of input terminals 20 and 21, and to a pair of input terminals 22 and 23. In addition, the commutator switches 18 and 19 must also possess an "open" position, i.e. it must be possible to interrupt the connection between the terminals 14 or 15, and 16 or 17 and the input terminals 20, 21 and 22 or 23. This position is shown in broken lines. The contact lines 6 and 8 which are not provided with terminals are connected, via a pair of on-off switches 24 and 25 to a terminal 26. A terminal 27 is connected to the substrate.

During operation, in accordance with two-phase operation, the contact lines 5 and 7 are fed, via the terminals 9 and 10, with in each case a pulse train of digital, preferably rectangular, timing pulses, which in the case of n-doping of the substrate are negative or in the case of a p-doping of the substrate are positive in relation to a reference potential, preferably ground. The substrate in biased via the substrate terminal 27 positively in relation to the reference potential when the substrate is n-doped and negatively when it is p-doped. The terminal 26 is positively biased in relation to the reference potential in the event of the n-doping of the substrate and negatively biased in the event of the p-doping of the substrate. A d.c. voltage is connected between the input terminals 20 and 21, and 22 and 23 of the commutator switches 18 and 19.

Figure 2:
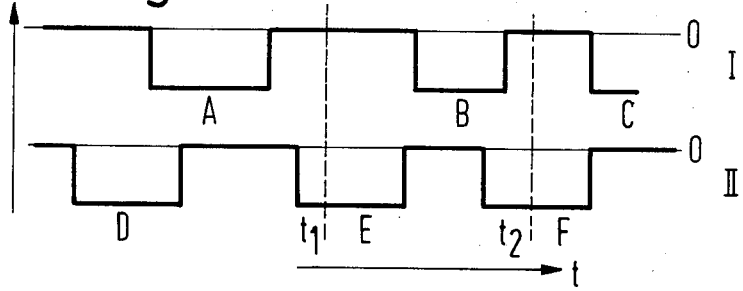
FIG. 2 illustrates two pulse trains extending over the time $t$.

Taking reference to FIGS. 2 to 5, the mode of operation of the device shown in FIG. 1 will be described. In this case the substrate will be assumed to be n-doped silicon. FIG. 2 shows two timing pulse trains I and II. The individual pulses A–C and D–F of these timing pulse trains I and II, respectively, are selected to be negative in relation to the reference potential, here ground. In accordance with a two-phase operation, pulses of the pulse train I must coincide in time with pulse gaps of the pulse train II, and vice versa. However, it is not necessary for the individual pulse edges to coincide in time. The pulse trains I and II represented in FIG. 2 indicate this fact.

The pulse train I will now be assumed to be connected to the contact line 5, and the pulse sequence II to the line 7. As a result of the temporary closure of the commutator switches 18 and 19, the capacitances 12 and 13 are charged in the same manner for example in such a way that the capacitor electrodes which are connected to the contact lines 6 and 8 are negatively charged in relation to the reference potential, here ground. The commutator switches can be in the form of a double-pole switch.

The substrate is biased via the substrate terminal 27 positively in relation to the reference potential. Consequently, on the one hand a sufficiently wide depletion zone is constantly produced beneath the first electrically insulating layer, which zone prevents majority carriers, here electrons, from hanging at the boundary of substrate and electrically insulating layer, and on the other hand this means that there is no necessity to connect very high voltage pulses to the electrodes. The positive bias of the substrate in relation to ground is not necessary. It is also possible to connect the substrate to ground and to select the reference potential to be sufficiently negative. When p-doping is used, the substrate would have to be negatively biased and the reference potential would have to be selected to be positive in relation to ground. The pulses of the pulse trains would then be selected to be positive in relation to the reference potential.

Figure 3:
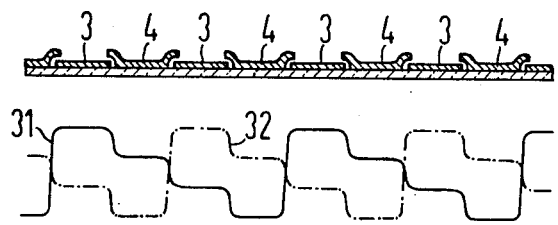
FIGS. 3–5 show the potential course in relation to the substrate for various operating states of the device.

At the time $t_1$ (see FIG. 2), the periodic potential course 31 (solid line) which is represented in FIG. 3 and falls in stair-case fashion to the right, is set up under the electrodes. As a result of this asymmetrical potential course, the charge shift direction is established as being towards the right. The dash-dot curve 32 in FIG. 3 represents the potential course at a later time $t_2$ (FIG. 2). The stair-case shaped potential course arises as a result of the charge state of the capacitors. Each adjacent second electrode on the right of a first electrode is, by virtue of the capacitive coupling, connected to a more negative potential than the first electrode.

Figure 4:

In order to transfer the direction of charge shift, the commutator switches 18 and 19 are temporarily closed so that the capacitances 12 and 13 are recharged. Thus, the adjacent second electrodes on the right of the first electrodes carry a more positive potential than the first electrodes. The stair-case shaped potential course 41 (assigned to the time $t_1$ in FIG. 2) represented in FIG. 4 is thus formed. The charge shift direction is now to the left. The d.c. voltage connected to the capacitors is preferably selected to be of a lesser magnitude than the substrate bias voltage, to ensure that an adequate depletion zone remains at the boundary layer between the substrate and the insulating layer. This also applies, of course, in the case of p-doping.

For the storage of the charges, the on-off switches 24 and 25, which are preferably in the form of a double-pole switch are closed for such time as the charges are to be stored. Consequently, during this time the contact lines 6 and 8 are clamped to a fixed potential. In the present case this potential is selected to be positive in relation to the reference potential. In the case of p-doping, on the other hand, it is selected to be negative. In the present case the amount of the potential difference is selected to be such that an adequate depletion zone remains at the boundary layer. Thus, this amount is most favorably selected to lie between 0 (ground) and the magnitude of the substrate potential.

Figure 5:
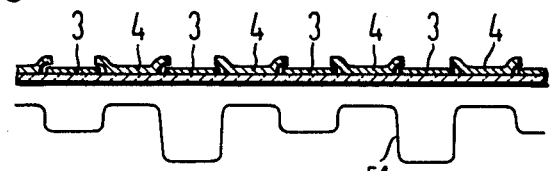

The curve 51 in FIG. 5 shows the associated potential course for the situation in which the amount is equal to half the amount of the substrate potential. The potential dips under the electrodes 3 oscillate on and off with the timing of the pulse trains. Also, it should be borne in mind that in the oscillation the capacitances are constantly partially charged and discharged. Consequently, a time lag of the oscillations occurs in relation to the pulse train which, however, is of no significance to the storage process. Existing charges are stored under the first electrodes 3 in the oscillating potential dips. Here, attention is invited to the fact that this is a dynamic store, i.e. that the charges can only be stored for a limited length of time.

The commutator switches 18, 19 and on-off switches 24, 25 can be in the form of electronic switches which are opened, switched-over and closed by the application of appropriate control pulses.

Figure 6:
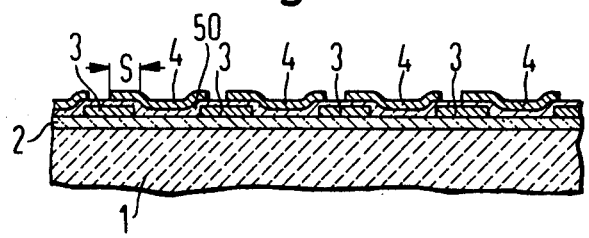
FIG. 6 shows a first possible way of forming the capacitors.

The capacitances 12 and 13 between the contact lines 5 and 6 and the lines 7 and 8 respectively, can be produced in such a way that each first electrode is overlapped at least by the adjacent second electrode on the one side, where the overlap width $s$ is greater than that of the adjacent second electrode on the other side. FIG. 6 shows a cross sectional view through such a chargecoupled shift device. Above the substrate 1 and the first electrically insulating layer 2 are arranged the first electrodes 3. These are covered with a second electrically insulating layer 50. Above the latter are arranged the second electrodes 4. These second electrodes overlap the first electrodes 3 adjoining on the left side by the overlap width $s$. The adjacent first electrode on the right-hand side are overlapped to a lesser extent. As a result of the overlap zone, between the second electrodes and the first electrodes is formed a capacitance which plays the role of the capacitances 12 and 13. For the transmission properties of a device in accordance with the invention it is favorable to make the capacitance between first and second electrode of the same magnitude as the capacitance between the first electrode and the substrate. This can be effected by a suitable selection of the thicknesses $d_1$ and $d_2$ of the first and second electrically insulating layer. In this case, we have $$\frac{d_1}{d_2} = \frac{E_1 F_1}{E_2 F_2},$$

where $E_1$ is the dielectric constant of the first electrically insulating layer, $E_2$ is the dielectric constant of the second electrically insulating layer, $F_1$ is the area of the first electrode, $F_2$ is the area of the overlap zone minus the area of the smaller overlap zone which is produced by the adjacent second electrode on the other side of the first electrode. The Si-Al-gate technique is particularly suitable for production of the device. However, other techniques are equally suitable. The overlap width $s$ is preferably selected to be greater than 4 $\mu$, as on the application of the second electrodes the masking causes an uncertainty of 2 $\mu$ in the overlap width. The width of the first electrodes must be selected to be greater than 9 $\mu$. A relatively large amount of space is thus consumed.

Figure 7:
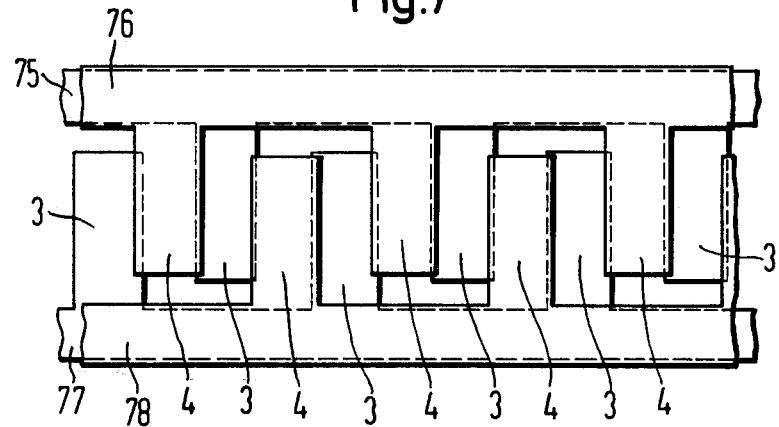
FIG. 7 shows a second possible way of forming the capacitors.

This disadvantage can be avoided if the pulse train lines are capacitively coupled. FIG. 7 shows a plan view of such an element. The first electrodes 3 are connected to a pair of strip-shaped contact lines 75 and 77. The second electrodes are connected by a pair of strips 76 and 78 which are located above the strips 75 and 77. In the case of the Si-Al-gate technique, the strip material for the strips 75 and 77 will be in the form of aluminum and that for the strips 76 and 78 will be polysilicon. Since the strips are arranged one above another they are capacitively coupled. Strips lying one above another are separated from each other by electrically insulating material. To define the transfer channel it is possible to use the channel-stop method, or the first electrically insulating layer under the strip 71 and 72 can be made sufficiently thick.

The devices which serve to introduce the charges can consist of a conventional diffusion zone. This zone serves during backwards movement to suck off the charge incoming at the end of the device and thus also to withdraw charges. Preferably the first and/or last electrode in the electrode row are used as gate electrodes, which control, according to free selection, the introduction or the removal of charge carriers independently of the operating timing pulses on the remaining electrodes of the series.

Although I have described my invention by reference to certain structures, many changes and modifications may become apparent to those skilled in the art without departing from the spirit and scope of the invention. I therefore intend to include within the patent warranted hereon all such changes and modifications as may reasonably and properly be included within the scope of my contribution to the art.

I claim:

1. A device for selectively shifting charges in a given direction or in the opposite direction and for storing charges selectively with a charge coupled charge shift arrangement comprising a substrate of doped semiconductor material, at least one first electrically insulating layer carried on said substrate, at least one row of first electrodes carried on said insulating layer and separated from one another by gaps, at least one row of second electrodes arranged at least over each gap and insulated from said first electrodes, means for the introduction and withdrawal of charges, a first pair of contact lines including first and second conductors respectively connecting each first electrode to alternate ones of said first electrodes in the row, and a second pair of contact lines including third and fourth conductors respectively connecting each second electrode to alternate ones of said second electrodes in the row, first capacitor means connecting said first and third conductors, second capacitor means connecting said second and fourth conductors, one of said first and second pairs of contact lines including terminals for receiving respective pulse trains, a d.c. voltage supply including a plurality of terminals, a commutator switch connecting said first and second pairs of capacitively connected contact lines to respective terminals of said voltage supply, said commutator switches including two closed switching conditions and an open condition, an on-off switch connecting said pair of contact lines which are not provided with terminals to a further terminal, and said substrate including a substrate connection to another supply terminal.

2. The device as claimed in claim 1, wherein said commutator switches and said on-off switch are in the form of electronic switches.

3. The device as claimed in claim 1, wherein said commutator switches are in the form of double-pole switches.

4. The device as claimed in claim 1, wherein said on-off switch is in the form of a double-pole switch.

5. The device as claimed in claim 1, wherein said substrate consists of doped silicon.

6. The device as claimed in claim 1, wherein said first electrodes consist of polysilicon, said second electrodes consist of aluminum and said first electrically insulating layer consists of $SiO_2$.

7. The device as claimed in claim 1, wherein said first and second capacitors comprise a structure wherein said contact lines are designed as strips which extend parallel to the substrate surface in the longitudinal direction of the rows on both sides of the rows of electrodes, two such strips being in different planes on each side and overlap in length, the lower strip in each case being above said first electrically insulating layer, and the overlying strip in the overlap zone being separated from said lower strip by electrically insulating material, said lower strips connected to said first electrodes, and said upper strips connected to said second electrodes.

8. The device as claimed in claim 1, wherein said first and second capacitors comprise a structure wherein each first electrode is overlapped at least by the adjacent second electrode on the one side, where the overlap width is greater than that of the adjacent second electrode on the other side.

9. The device as claimed in claim 8, characterized in that the overlap width of the adjacent second electrode on the one side is more than 4 $\mu$.

10. The device as claimed in claim 8, wherein portions of said first electrically insulating layer are disposed in the overlap zones between said first and said second electrodes.

11. The device as claimed in claim 8, wherein the thickness of said first electrically insulating material in the overlap zone is to the thickness of the first electrically insulating layer as the area of the overlap zone on the one side minus the area of the overlap zone on the other side times the dielectric constant of the insulating material is to the area of the first electrode times the dielectric constant of the first electrically insulating layer.

* * * * *